(12) United States Patent
Minamio et al.

(10) Patent No.: US 7,294,907 B2
(45) Date of Patent: Nov. 13, 2007

(54) SOLID-STATE IMAGING DEVICE AND METHOD FOR MANUFACTURING THE SAME

(75) Inventors: Masanori Minamio, Takatsuki (JP); Kouichi Yamauchi, Takatsuki (JP); Kenichi Nishiyama, Nakakubiki-gun (JP); Kiyokazu Itoi, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 25 days.

(21) Appl. No.: 10/876,839

(22) Filed: Jun. 25, 2004

(65) Prior Publication Data

US 2005/0001219 A1   Jan. 6, 2005

(30) Foreign Application Priority Data

Jul. 1, 2003  (JP) .............................. 2003-189776

(51) Int. Cl.
*H01L 29/40* (2006.01)
(52) U.S. Cl. ..................... 257/621; 257/667; 257/774
(58) Field of Classification Search ............... 257/666, 257/676, 704, 708, 729, 730
See application file for complete search history.

(56) References Cited

U.S. PATENT DOCUMENTS 6,014,318 A * 1/2000 Takeda ....................... 361/764
6,049,124 A * 4/2000 Raiser et al. ................ 257/712
6,195,258 B1 * 2/2001 Tsai et al. .................... 361/704
6,384,472 B1 * 5/2002 Huang ......................... 257/680
6,847,103 B1 * 1/2005 Perez et al. .................. 257/676

FOREIGN PATENT DOCUMENTS

| JP | 56-10975    |   | 2/1981  |
| JP | 63-241937   |   | 10/1988 |
| JP | 03-133146   | * | 6/1991  |
| JP | 2001-77277  |   | 3/2001  |
| JP | 2002-231913 |   | 8/2002  |
| JP | 2003-152123 |   | 5/2003  |

\* cited by examiner

*Primary Examiner*—Wai-Sing Louie
(74) *Attorney, Agent, or Firm*—Hamre, Schumann, Mueller & Larson, P.C.

(57) ABSTRACT

A solid-state imaging device includes a housing having a resin-molded base and ribs; metal lead pieces embedded in the housing, the metal lead pieces each having an inner terminal portion facing an inner space of the housing, an outer terminal portion exposed at a bottom surface of the housing, and a lateral electrode portion exposed at an outer lateral surface of the housing; an imaging element fixed on the base in the inner space; connecting members connecting electrodes of the imaging element respectively to the inner terminal portions; and a transparent plate fixed to an upper surface of the ribs. The die pad having a through hole is embedded in a center portion of the base so that the die pad's upper and lower surfaces are exposed, and the imaging element is fixed on the die pad. A ventilation hole to the inner space of the housing that is formed in one piece with a resin can be formed easily with a simple configuration.

5 Claims, 8 Drawing Sheets

SOLID-STATE IMAGING DEVICE AND METHOD FOR MANUFACTURING THE SAME

FIELD OF THE INVENTION

The present invention relates to solid-state imaging devices in which an imaging element, such as a CCD or the like, is mounted on a base, as well as to methods for manufacturing the same.

BACKGROUND OF THE INVENTION

Solid-state imaging devices, which are widely used for video cameras and still cameras or the like, are provided in form of a package, in which an imaging element, such as a CCD or the like, is mounted on a base made of an insulating material, with the photo-detector region being covered by a transparent plate. In order to make the device more compact, the imaging element is mounted on the base as a bare chip. FIG. 10 shows the solid-state imaging device disclosed in JP 2001-77277, which is a conventional example of such a solid-state imaging device.

In FIG. 10, numeral 41 denotes a housing, which is made of a base 41a and frame-shaped ribs 41b formed in one piece by resin-molding. An inner space 42 is formed on the upper side of the housing 41. A die pad 43 positioned at the center of the base 41a and leads 44 positioned below the ribs 41b are embedded in the housing 41. An imaging element chip 45 disposed at the center of the inner space 42 is fixed to the upper side of the die pad 43. The leads 44 include inner terminal portions 44a that are exposed to the inner space 42 at the upper side of the base 41a on the inner side of the ribs 41b and outer terminal portions 44b that are accessible from the bottom side of the base 41a below the ribs 41b. The inner terminal portions 44a and the bonding pads of the imaging element chip 45 are connected by bonding wires 46 made of metal. A transparent sealing glass cover 47 is fixed to the upper surface of the ribs 41b, thus forming a package for protection of the imaging element chip 45.

This solid-state imaging device is mounted on a circuit board with the sealing glass cover 47 facing upward, as shown in FIG. 10, and the outer terminal portions 44b are used to connect it to the electrodes on the circuit board. Although not shown in the drawings, a lens barrel incorporating an imaging optical system, whose relative position to the photo-detector region formed in the imaging element chip 45 is adjusted with a predetermined precision, is mounted on top of the sealing glass cover 47. During the imaging operation, object light that has passed through the imaging optical system incorporated in the lens barrel is focused on the photo-detector region and photoelectrically converted.

A solid-state imaging device with such a configuration is connected by the outer terminal portions 44b exposed at the bottom surface of the housing to electrodes on the circuit board, so that the height and the occupied surface area of the package are smaller than in configurations using a connection with outer leads bent downward from the sides of the housing, thus making it suitable for high-density packaging.

In the technology disclosed in JP 2001-77277A, an upper mold 48 and a lower mold 49 as shown in FIG. 11 are used to resin-mold the housing 41 of the shape shown in FIG. 10. The upper side of the lower mold 49 is flat. The lower side of the upper mold 48 is provided with recessed portions 48a corresponding to the ribs 41b. An inner protruding portion 48b forming the inner space 42 and outer protruding portions 48c forming the outer surface of the ribs 41b are provided at both sides of the recessed portions 48a. The leads 44 and the mold pad 43 are supplied in integrated form as a lead frame 50, and are disposed between the upper mold 48 and the lower mold 49.

By interposing the lead frame 50 between the upper mold 48 and the lower mold 49, a cavity 51 for molding the base 41a is formed between the lower mold 49 and the inner protruding portion 48b of the upper mold 48. In this state, a resin is filled, the mold is opened and the molded product is retrieved, with the base 41a and the ribs 41b forming the housing 41 having their finished form. After the molding, the lead frame 50 is cut at locations positioned at the outer side of the ribs 41b.

In the solid-state imaging device of this conventional example, the inner space 42 is sealed by the sealing glass cover 47, forming a hermetically sealed space. Therefore, there may be deformations due to pressure fluctuations inside the inner space 42 caused by temperature changes or the like, and the connection between the imaging element chip 45 and the inner terminal portions 44a may be damaged.

Furthermore, the thickness of the inner terminal portions 44a of the leads 44 is about half of the thickness below the ribs 41b, and the lower surface of the inner terminal portions 44a is not exposed at the bottom surface of the base 41a. This shape of the leads 44 may cause the following problems:

In order to embed the leads 44 at the suitable positions, the resin is filled in while the leads 44 are held by the upper and lower molds, and their position is fixed. Therefore, the leads 44 have to be clamped between the upper mold 48 and the lower mold 49. However, as mentioned above, the inner terminal portions 44a of the leads 44 located at the inner space 42, have a thickness that does not reach the bottom surface of the base 41a, so that it is difficult to clamp them with the upper and lower molds.

For this reason, with the technology disclosed in JP 2001-77277A, the leads 44 are positioned by clamping those portions of the leads 44 that are further to the outer side than the outer terminal portions 44b with the lower mold 49 and the outer protruding portion 48c of the upper mold 48. Thus, ultimately, the inner terminal portions 44a are molded while not being clamped between the upper and lower molds. Consequently, it is not possible to attain a condition in which the inner protruding portion 48b of the upper mold 48 is pressed with sufficient force and close contact against the upper surface of the inner terminal portions 44a. Therefore, the generation of a resin burr at the edge of the inner terminal portions 44a cannot be avoided. Due to this resin burr, the connection area of the inner terminal portions 44a may be narrowed considerably, and may result in defective connections.

The following explains how the conventional configuration impedes miniaturization. As shown in FIG. 11, an outer protruding portion 48c is necessary at the outer side of the ribs 41b, in order to form the outer surface of the ribs 41b and finish the outer shape of the ribs 41b when resin-molding. As a result, while it becomes possible to clamp the leads 44 at that portion, the following problems occur.

There is a lower limit for the width of the upper surface of the ribs 41b that is given by the surface area necessary for applying the adhesive for adhering the sealing glass cover 47. That is to say, there is a limit to how small the width of the ribs 41b can be made, and this impedes further miniaturization of the surface area of the semiconductor device. Moreover, when the ribs 41b are molded, a taper (not shown)

for mold release has to be provided at the side surfaces, and the presence of this taper also causes an increase of the width of the ribs 41*b*.

SUMMARY OF THE INVENTION

It is an object of the present invention to provide a solid-state imaging device in which a through hole to an inner space of a housing formed in one piece by a resin can be formed easily with a simple configuration.

It is another object of the present invention to provide a solid-state imaging device whose metal lead pieces having an inner terminal portion and an outer terminal portion have such a shape that the creation of resin burrs at the inner terminal portions can be suppressed.

It is another object of the present invention to provide a method for manufacturing a compact solid-state imaging device suitable for mass production, by resin-molding the housing in one piece with a member forming the above-described leads and through hole.

A solid-state imaging device according to the present invention includes: a housing having a base and ribs forming a rectangular frame that are molded in one piece with a resin; a plurality of metal lead pieces embedded in the housing, the metal lead pieces having an inner terminal portion facing an inner space of the housing, an outer terminal portion exposed on a bottom surface of the housing, and a lateral electrode portion exposed at an outer lateral surface of the housing; an imaging element fixed on the base in the inner space of the housing; connecting members connecting electrodes of the imaging element respectively to the inner terminal portions of the metal lead pieces; and a transparent plate fixed to an upper surface of the ribs. A die pad having a through hole is embedded in a center portion of the base so that upper and lower surfaces of the die pad are exposed from the base, and the imaging element is fixed on the die pad.

In accordance with the present invention, a method for manufacturing a solid-state imaging device includes: resin-molding a housing having a base and ribs forming a rectangular frame, with a lead frame embedded in one piece, the lead frame including a group of metal lead pieces as well as a die pad arranged at a center portion of the base, so that the metal lead piece forms an inner terminal portion facing an inner space of the housing, an outer terminal portion exposed at a bottom surface of the housing, and a lateral electrode portion exposed at an outer lateral surface of the housing; fixing an imaging element on the base in the inner space of the housing; connecting electrodes of the imaging element respectively by connecting members to the inner terminal portions of the metal lead piece; and fixing a transparent plate to an upper surface of the ribs. The method includes the following features:

The lead frame comprises a plurality of sets of lead portions for forming the group of the metal lead pieces and die pads having a through hole, in correspondence with a plurality of solid-state imaging devices. Molds for forming the housing are configured so as to form a plurality of housing-equivalent portions equivalent to a plurality of housings such that the ribs of adjacent housing-equivalent portions are joined together and molded as one rib. The resin-molding is performed with the lead frame being placed so that the lead portions and the die pads are arranged at positions of the mold that correspond to the housing-equivalent portions and so that the inner terminal portions and the die pads are exposed facing the inner space, and the outer terminal portions and the die pads are exposed at the reverse side of the base. After fixing the imaging element on the die pad in the inner space of each of the housing-equivalent portions, connecting electrodes of the imaging element with the inner terminal portions by connecting members, and fixing the transparent plate to the upper side of the ribs, the respective solid-state imaging devices are separated into individual pieces by cutting in a direction perpendicular to the base so that the width of the ribs is cut in half with respect to the planar shape.

DESCRIPTION OF THE PREFERRED EMBODIMENTS

Figure 1A:
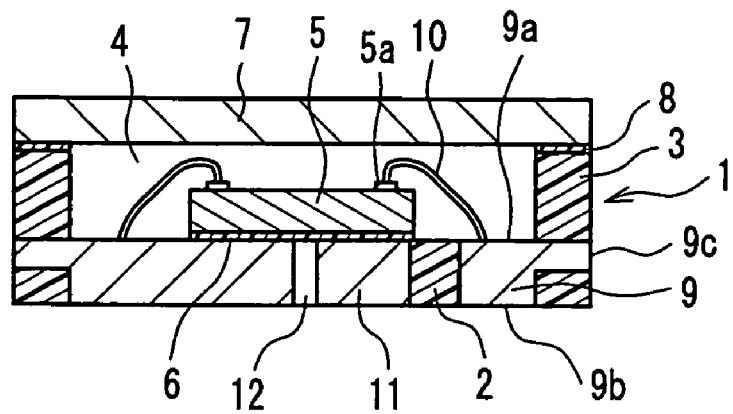
FIG. 1A is a cross-sectional view showing a configuration of a solid-state imaging device in accordance with Embodiment 1 of the present invention.

In the solid-state imaging device according to the present invention, the die pad as well as the metal lead pieces including an inner terminal portion, an outer terminal portion, and a lateral electrode portion are embedded in the housing resin-molded in one piece. The die pad has a through hole in a center portion and embedded in the base of the housing so that the die pad's upper and lower surfaces are exposed, and the imaging element is fixed on the die pad. With this configuration, the metal lead pieces and the die pad are formed using a lead frame, and a ventilation hole of the inner space can be formed easily by the through hole provided in the die pad.

In this solid-state imaging device, it is preferable that a thickness of the metal lead pieces at the position of the inner terminal portions is substantially the same as the thickness of the base, and the outer terminal portions are formed on a reverse surface corresponding to the position of the inner terminal portions. Thus, when resin-molding, the inner terminal portions and the outer terminal portions can be clamped by the upper and lower molds, and the surface of the inner terminal portions is pressed down by the surface of the upper mold and is in close contact therewith, so that the generation of resin burrs can be suppressed.

It is preferable that a lower surface of the lateral electrode portions of the metal lead pieces is covered by the resin of the base. Thus, the metal lead pieces are fixed reliably to the housing. A surface of the outer terminals and the die pad may be formed substantially flush with a reverse surface of the base. Alternatively, a surface of the outer terminals and the die pad may protrude from a reverse surface of the base.

It is preferable that the imaging element is fixed on the die pad with an air-permeable adhesive tape.

With the method for manufacturing a solid-state imaging device according to the present invention, the ventilation hole of the inner space can be formed easily, due to the same reasons as explained for the above-described solid-state imaging device. Moreover, the ribs between adjacent housing-equivalent portions are formed as one rib, which is cut into two portions in the width direction when separating the solid-state imaging devices into individual pieces, so that the surface area of the solid-state imaging devices can be made smaller. This is explained in the following.

If each rib is formed individually as in the conventional art, then it is necessary to provide the upper surface of the ribs with a sufficient width for applying the adhesive for fixing the transparent plate. In contrast, if the two ribs are formed as one, then a sufficient width for applying the adhesive can also be ensured even if the width is smaller than twice of that of each rib molded individually. Consequently, by cutting this rib in half, it becomes possible to employ a rib width that is narrower than that available conventionally. Moreover, if the ribs are molded individually, it is necessary to provide the lateral surface of the rib with a taper for mold release, whereas such a taper is not necessary if the ribs are cut in the width direction, and the cutting surface is perpendicular to the base. This also makes it possible to reduce the width.

In the above-described manufacturing method, it is preferable that a thickness of the lead portions at a position corresponding to the inner terminal portions is substantially the same as a thickness of the base, and during the resin-molding, a portion corresponding to the inner terminal portions of the lead portions is clamped between a lower mold and a portion of an upper mold forming the inner space of the housing. Thus, during the resin-molding, the surface of the inner terminal portions is pressed down by the surface of the upper mold and is in close contact therewith, so that the generation of resin burrs can be suppressed.

In the above-described manufacturing method, the transparent plate that is fixed may have a size spanning the plurality of housing-equivalent portions, and when cutting the housing-equivalent portions, the transparent plate is cut together with the housing-equivalent portions. Alternatively, a plurality of the transparent plates may be used for the respective housing-equivalent portions and an adhesive is applied to the upper surface of the ribs, so that the respective transparent plate are placed on the respective housing-equivalent portions, with a gap being formed between the edges of adjacent transparent plates, forming a fillet by the adhesive in the gap between the edges of the transparent plates.

In the above-described manufacturing method, it is preferable that the imaging element is fixed on the base, with an insulating adhesive tape having air permeability being placed between the imaging element and the base.

The following is a more detailed description of embodiments of the present invention, with reference to the accompanying drawings.

Embodiment 1

Figure 2:
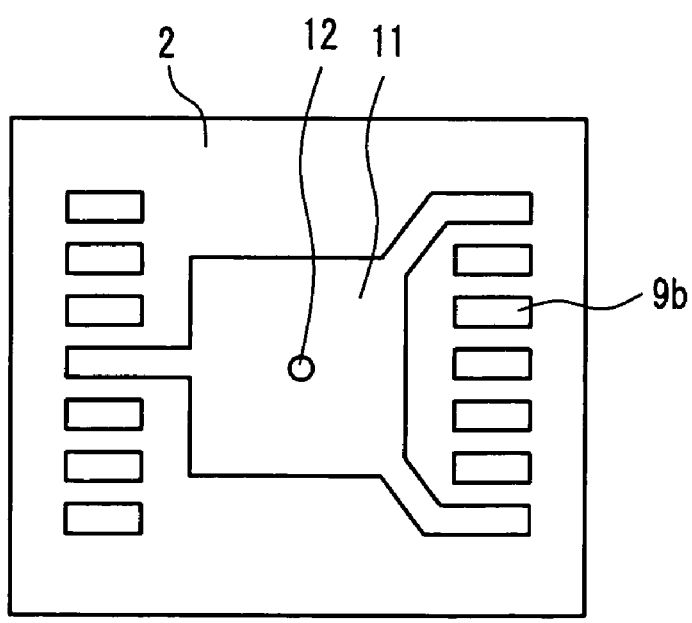
FIG. 2 is a bottom view of the solid-state imaging device of FIG. 1A.
Figure 3:
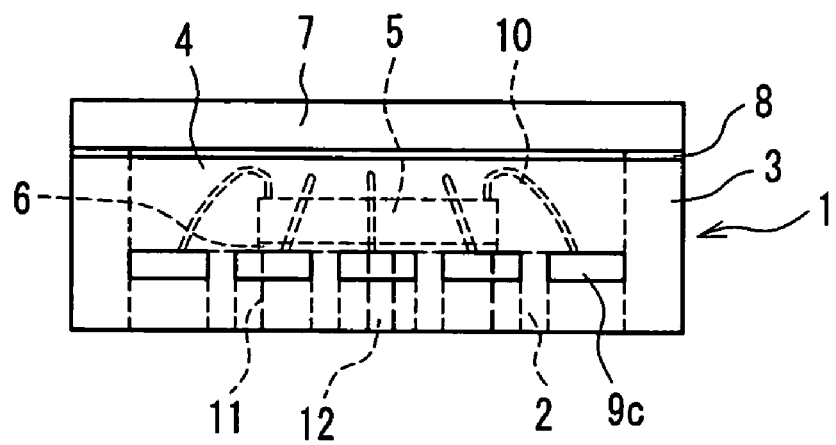
FIG. 3 is a lateral view of the solid-state imaging device of FIG. 1A.

FIG. 1A is a cross-sectional view, FIG. 2 is a bottom view and FIG. 3 is a lateral view of a solid-state imaging device in accordance with Embodiment 1.

Numeral 1 denotes a housing made of a plastic resin, such as epoxy resin, having ribs 3 arranged as a rectangular frame on a planar base 2 and fabricated by molding in one piece. An imaging element 5 is fixed by a bonding member 6 on a base 2 facing the inner space 4 of the housing 1. A transparent plate 7 made of glass, for example, is fixed with an adhesive 8 to the upper surface of the ribs 3, thus sealing an inner space 4 of the housing 1 and forming a package. The height of the ribs 3 is set in the range of 0.3 to 1.0 mm, for example.

Figure 4:
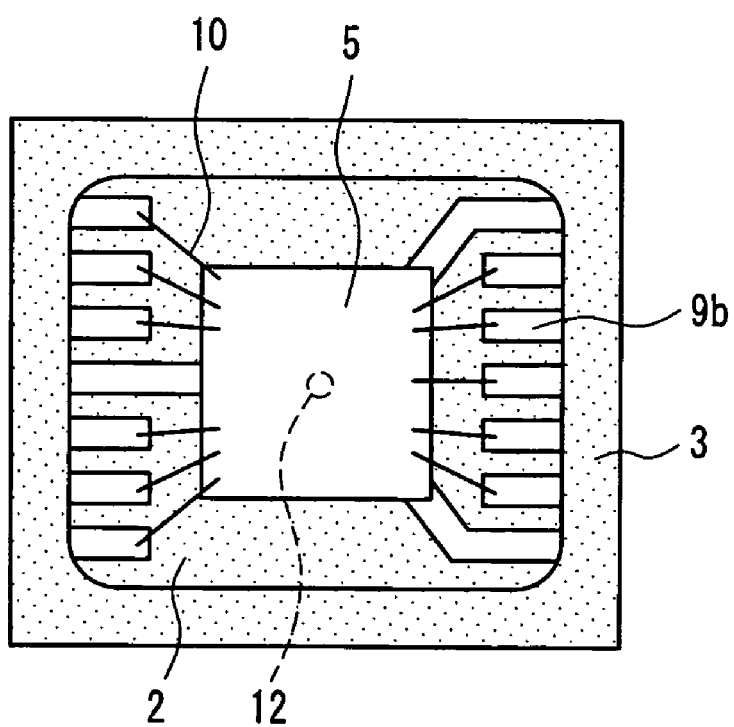
FIG. 4 is a plan view of the solid-state imaging device in FIG. 1A without the transparent plate.

A plurality of metal lead pieces 9 and a die pad 11 are embedded in the housing 1 during the molding. The metal lead pieces 9 are members for providing electrical leads from the inner space 4 of the housing 1 to the outside, and include an inner terminal portion 9a exposed at the surface of the base 2 on the side of the inner space 4, an outer terminal portion 9b exposed on the reverse surface of the base 2 at a position corresponding to the inner terminal portion 9a, and a lateral electrode portion 9c exposed at the outer lateral surface of the base 2. The pad electrodes 5a of the imaging element 5 and the inner terminal portions 9a of the metal lead pieces 9 are connected by thin metal wires 10. The die pad 11 has a through hole 12 and is embedded such that its upper and lower surfaces are exposed from the base 2. The thickness of the overall package is set to not more than 2.0 mm, for example. FIG. 4 is a top view of the planar shape of the solid-state imaging device in FIG. 1A without the transparent plate 7.

The through hole 12 of the die pad 11 functions as a ventilation hole between the inner space 4 and the outside. By fixing the transparent plate 7, the inner space 4 becomes hermetically sealed, which may lead to mechanical damage due to fluctuations in internal pressure, for example. It is effective for avoiding this to provide a through hole 12 as a ventilation hole in the die pad 11. In order to let this through hole 12 function as a ventilation hole, it is preferable that the imaging element 5 is adhered in a way that ensures sufficient air permeability at the lower side of the imaging element 5. For example, it may be adhered using an air-permeable adhesive tape as the bonding member 6. Alternatively, the lower surface of the peripheral portion of the imaging element 5 may be provided with a bevel cut and the through hole 12 may be provided in correspondence with this bevel cut portion. The shape of the through hole 12 may be chosen as appropriate. For example, its cross-sectional shape may be tapered, or it may be a stepped hole.

As shown in FIG. 1A, the reverse side of the inner terminal portions 9a of the metal lead pieces 9 form the outer terminal portions 9b. Moreover, at these portions, the metal lead pieces 9 have substantially the same thickness as the base 2. Consequently, during the resin-molding, it is possible to clamp the inner terminal portions 9a and the outer terminal portions 9b with the upper and lower molds. Thus, the surface of the inner terminal portions 9a is pressed down by the surface of the upper mold and is in close contact therewith, so that the generation of resin burrs can be suppressed. Portions of the metal lead pieces 9 that are located below the ribs 3 are formed to be thin by half-etching, for example, and their bottom surface is covered by resin.

As shown in FIGS. 1A and 3, the outer surface of the housing 1, that is, the outer peripheral surface of the ribs 3 forms a planar surface that is substantially perpendicular to the surface of the base 2. Moreover, the end surface of the transparent plate 7 and the surface of the lateral electrode portions 9c are substantially flush with the outer lateral surface of the housing 1. Such a flush shape can be formed with a favorable flatness by cutting the ribs 3 and the transparent plate 7 together during the manufacturing process.

The inner peripheral surface of the housing 1, that is, the inner surface of the ribs 3 is tapered (not shown) so that it widens from the surface of the base 2 to the transparent plate 7. This is in order to facilitate mold release after the resin-molding, but using this taper, it is also possible to ensure that reflections of incident light at the inner surface of the ribs 3 substantially do not adversely affect the imaging function. In practice, the inclination angle of the plane forming the inner surface of the ribs 3 is set to a range of 2 to 12° with respect to the direction perpendicular to the plane of the base 2. It is also possible to provide the inner surface of the ribs 3 with a matte finish or make it grainy, in order to reduce the influence of reflections by the inner surface of the ribs 3.

Figure 1B:
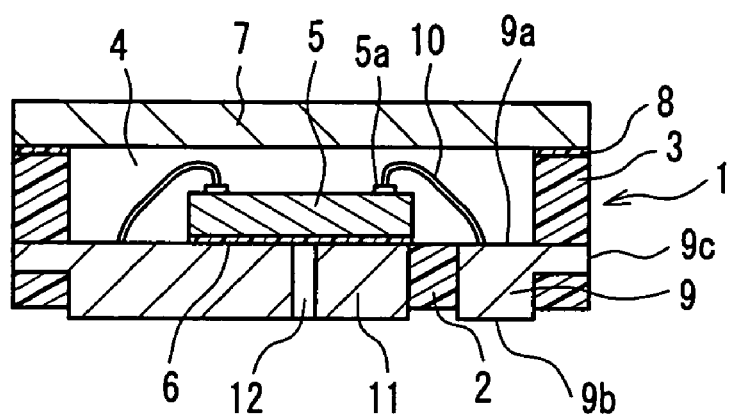
FIG. 1B is a cross-sectional view showing a solid-state imaging device in accordance with another embodiment of the present invention.

In FIG. 1A, the surfaces of the outer terminal portions 9b and the die pad 11 are shown to be substantially flush with the reverse surface of the base 2, but they may also be set back with respect to the reverse surface of the base 2. It is also possible that the surfaces of the outer terminal portions 9b and the die pad 11 protrude from the reverse surface of the base 2, as shown in FIG. 1B. The arrangement may be chosen as appropriate with regard to the intended use and the manufacturing process. Moreover, the surface of the lateral electrode portions 9c also may be set back from the outer surface of the housing 1.

Embodiment 2

Figure 5:
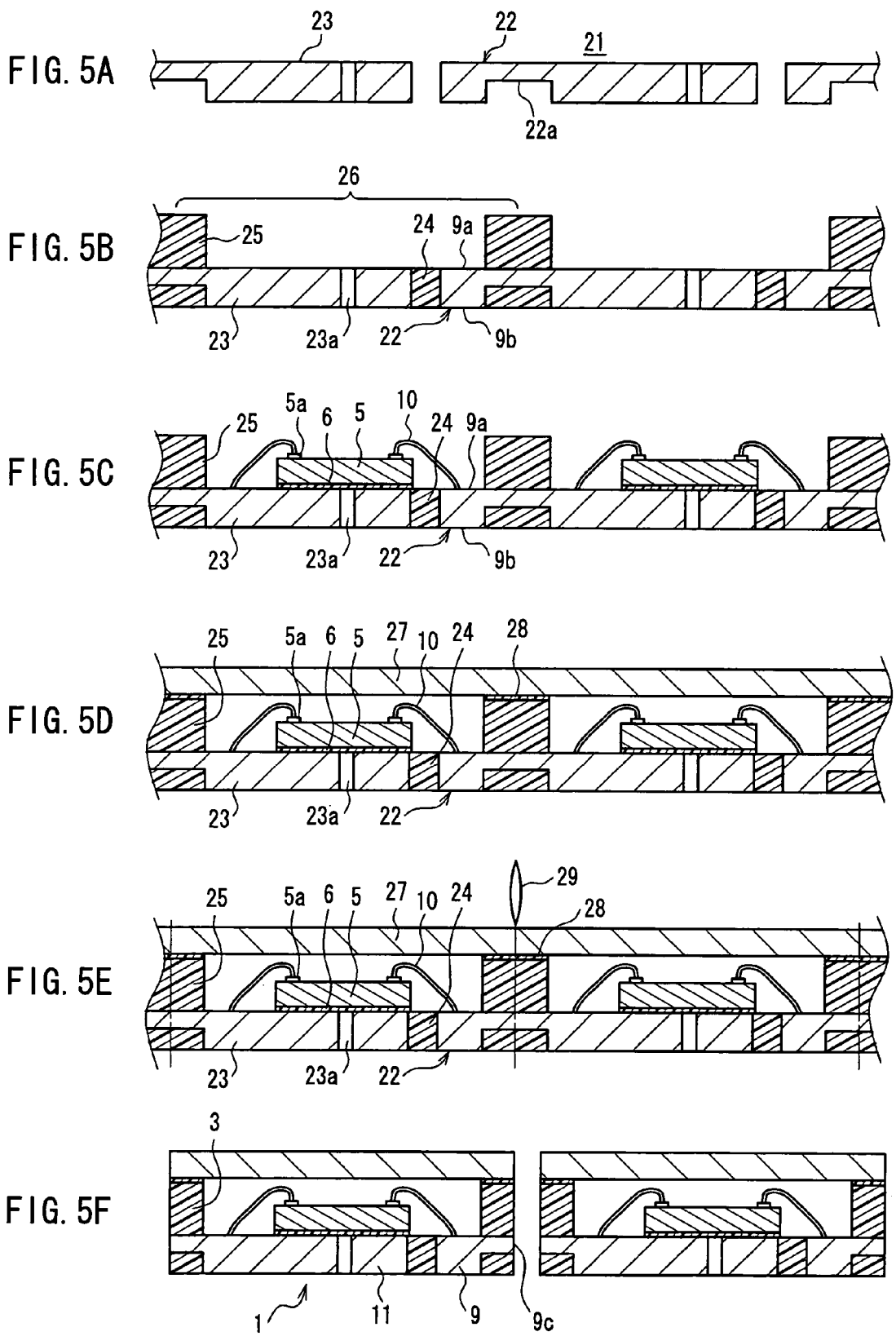
FIG. 5A to 5F are cross-sectional views illustrating a method for manufacturing a solid-state imaging device according to Embodiment 2 of the present invention.
Figure 6:
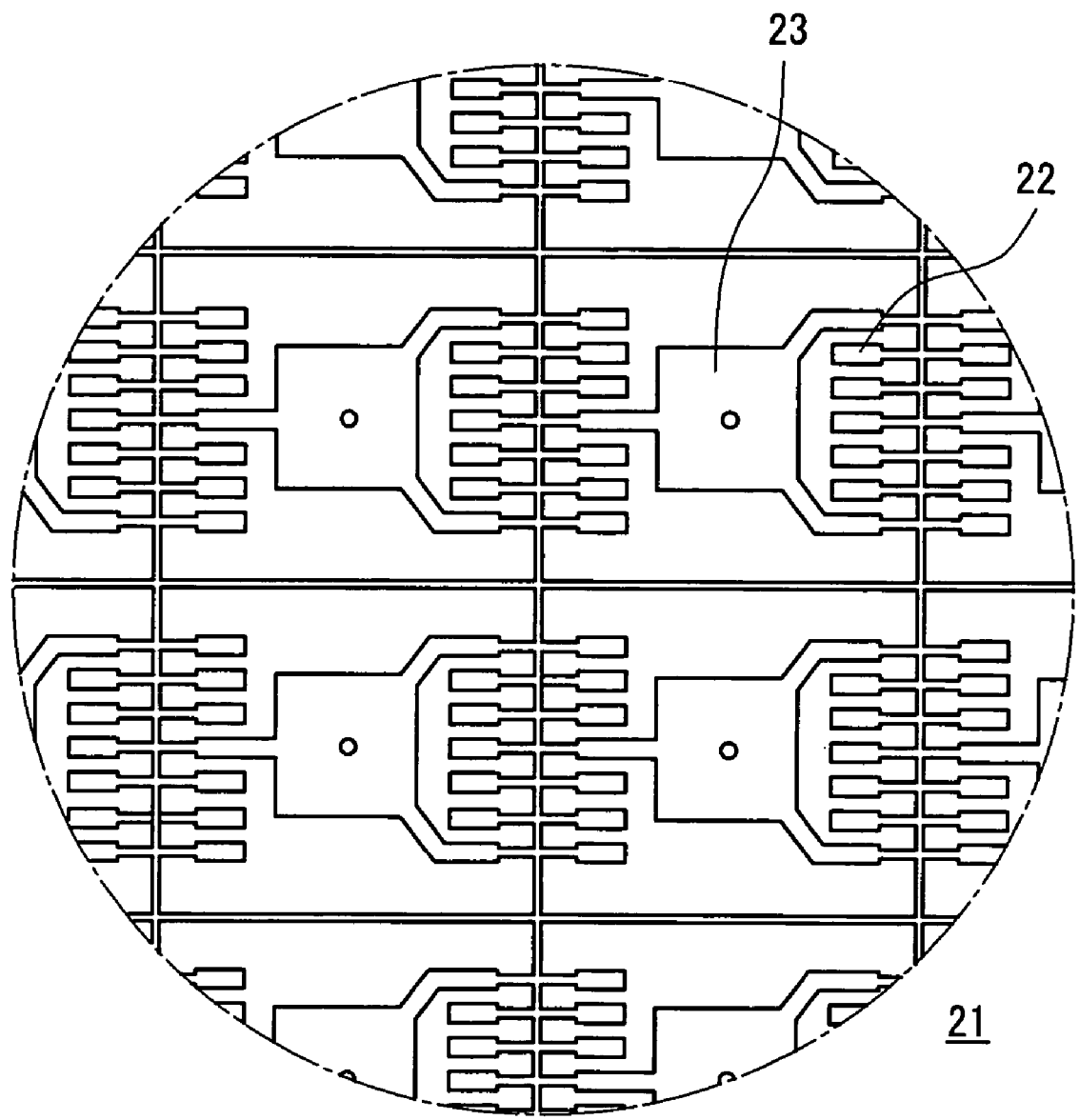
FIG. 6 is a plan view of the lead frame in this manufacturing method.
Figure 7:
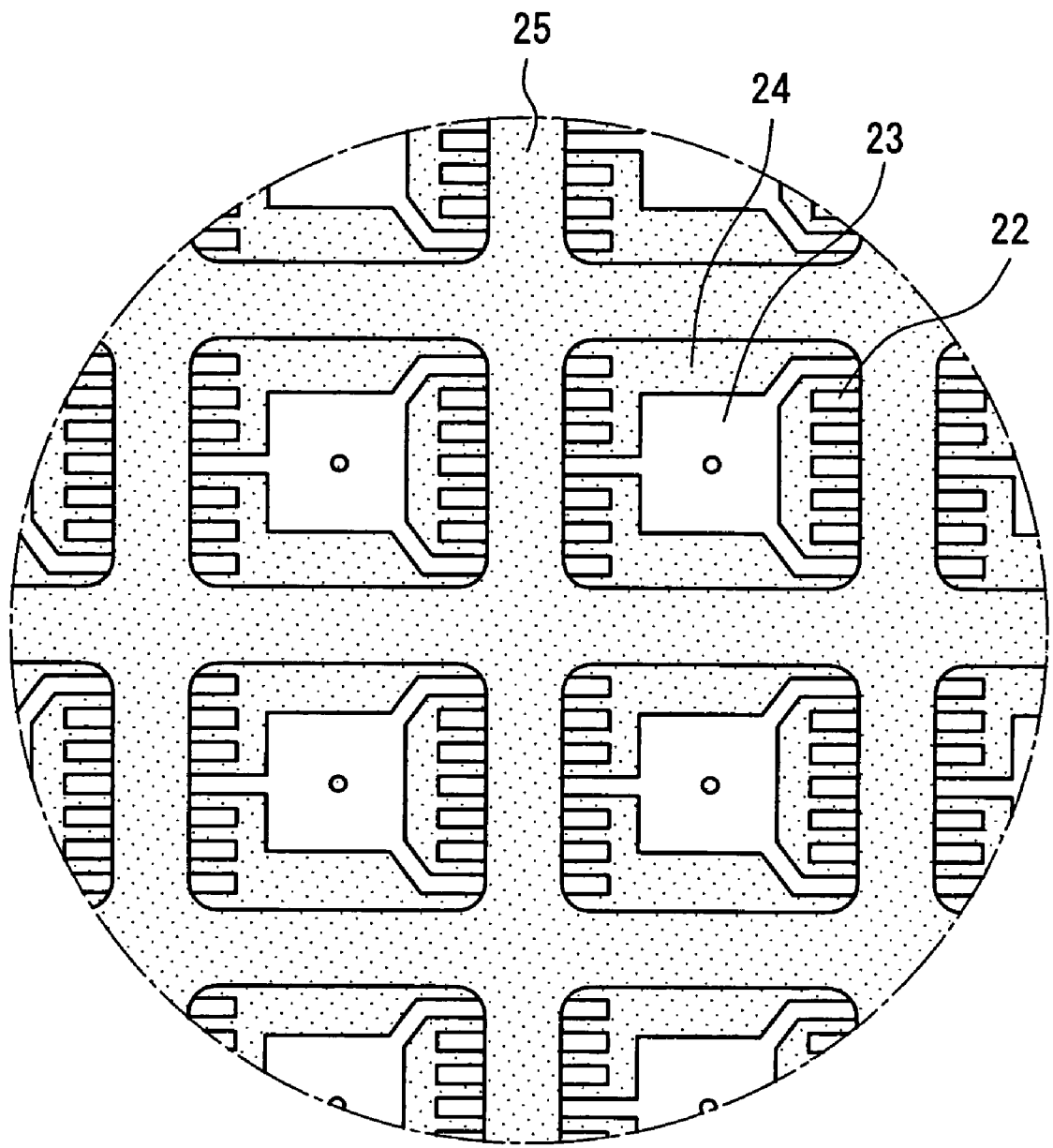
FIG. 7 is a plan view of the molded resin product molded by embedding the lead frame in this manufacturing method.

A method for manufacturing a solid-state imaging device according to Embodiment 2 is explained with reference to FIG. 5 to 7. This manufacturing method is for manufacturing a solid-state imaging device with a configuration in accordance with Embodiment 1.

First, as shown in FIG. 5A, a lead frame 21 is prepared. For the lead frame 21, a plurality of die pads 23 and lead portions 22 for forming the metal lead pieces 9 shown in FIG. 1A are laid out continuously, as shown in the plan view of FIG. 6. The thickness of the lead portions 22 at the positions corresponding to the inner terminal portions 9a is adjusted to be substantially the same as the thickness of the base 2. The lead portions 22 have recessed portions 22a formed in their bottom surface by half-etching, and the shape of the metal lead pieces 9 shown in FIG. 1A is attained by cutting at this portion in a later process step.

Next, the lead frame 21 is embedded, as shown in FIG. 5B, and molded in one piece with a resin, thus fabricating a molded product including a plurality of housing-equivalent portions 26 with bases 24 and ribs 25. FIG. 7 shows the planar shape after the molding. The embedding is performed such that the upper and lower surfaces of the lead portions 22 are exposed at the upper and lower surface of the bases 24, forming the inner terminal portions 9a and the outer terminal portions 9b. Also the die pad 23 is embedded such that its upper and lower surfaces are exposed, and its upper and lower side are in communication with one another through a through hole 23a. The ribs 25 are formed such that adjacent housing-equivalent portions 26 are linked by single ribs.

Next, as shown in FIG. 5C, an imaging element 5 is fixed with an adhesive 6 on the die pad 23 within the inner space of each housing-equivalent portion 26 enclosed by the ribs 25, and the pad electrodes 5a of the imaging element 5 and the inner terminal portions 9a are connected by thin metal wires 10.

Then, as shown in FIG. 5D, an adhesive 28 is applied to the upper surface of the ribs 25, and a transparent plate 27 is placed thereon.

Then, as shown in FIG. 5E, the transparent plate 27, the ribs 25, the lead portions 22 and the base 24 are cut with a dicing blade 29, and separated into pieces forming individual solid-state imaging devices, as shown in FIG. 5F. As shown in FIG. 5E, the cutting is performed in a direction perpendicular to the base 24, such that the width of the ribs 25 in the planar shape is cut in half. As a result, the cut transparent plate 27, ribs 25, lead portions 22 and bases 24 form a transparent plate 7, metal lead pieces 9 and housings 1 made of a base 2 and ribs 3 constituting one solid-state imaging device. Moreover, the lateral electrode portions 9c of the metal lead pieces 9 are exposed.

With the manufacturing method of this embodiment, the width of the one rib 25 in which the two ribs of two adjacent housing-equivalent portions 26 have been formed as one can be set to a smaller width than when the ribs are each molded individually. Consequently, when this one rib 25 is cut in half as shown in FIG. 5E, the width of the ribs 3 of each individual solid-state imaging device as shown in FIG. 5F becomes smaller than when each of the ribs is formed individually, and the surface area of the solid-state imaging element can be reduced accordingly.

In such a configuration, it is possible to ensure a width of the ribs 25 in a range that is sufficient for applying the adhesive for adhering the transparent plate 27. In the most extreme housing, if the ribs 25 are formed with the same width as the individually formed ribs and then cut in two pieces, then the width of the ribs 3 after the cutting can be made half that in the conventional example.

Moreover, when cutting the ribs 25 in two pieces in the width direction, the cutting plane is perpendicular to the base 24. By contrast, if the ribs are formed individually as in the conventional art, then a taper for breaking the device from the mold after molding has to be provided on the outer lateral surface of the ribs. Consequently, the surface area of ribs that are fabricated in accordance with the present invention is reduced by the amount saved by not providing the taper portion.

Furthermore, since the transparent plate 27, the ribs 25 and the lead portions 22 are cut together with the same dicing blade 29, the lateral surface of the package, which is formed by the end surface of the transparent plate 27, the lateral surface of the housing 1, and the end surface of the metal lead pieces 9, is substantially flush, and a favorable degree of flatness can be attained. Consequently, when mounting the device in the lens barrel accommodating the optical system, positioning of the optical system with respect to the photo-detector portion of the imaging element 5 can be performed with high precision utilizing the lateral face of the package. That is to say, the lens barrel easily can be positioned horizontally with respect to the device by abutting the inner surface of the lens barrel against the lateral surface of the package. It should be noted that the positioning in the vertical direction can be performed by abutting the lower surface of the lens barrel against the circuit board surface.

Referring to FIG. 8, the following is a more specific explanation of the process step for molding the housing with a resin, as shown in FIG. 5B of the above-described manufacturing process.

Figure 8A:
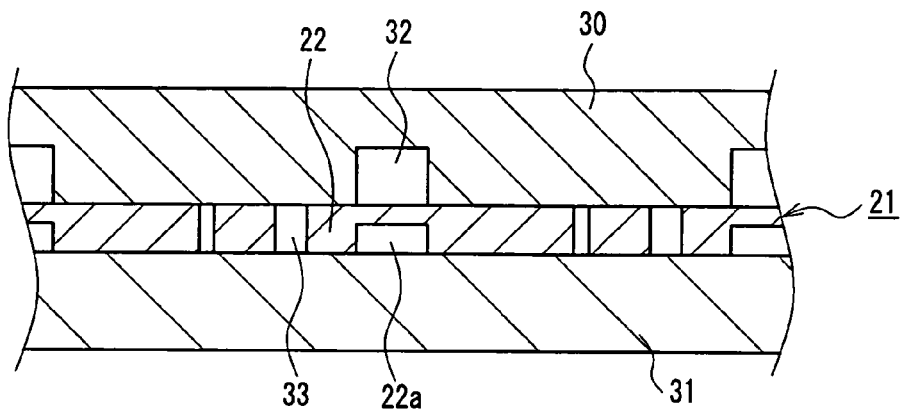
FIG. 8A to 8C are cross-sectional views showing a resin-molding step of this manufacturing method in more detail.

First, as shown in FIG. 8A, a lead frame 21 is arranged between the upper mold 30 and the lower mold 31, and the upper and lower surfaces of the lead portions 22 are clamped by the upper mold 30 and the lower mold 31. The upper surface of the lower mold 31 is flat, but a recessed portion 32 is provided on the lower surface of the upper mold 30. By interposing the lead portions 22, the space 33 formed between the upper mold 30 and the lower mold 31, the space of the recessed portion 32 of the upper mold 30, and the space of the recessed portion 22a of the lead portions 22 form the cavities for the resin-molding.

Figure 8B:
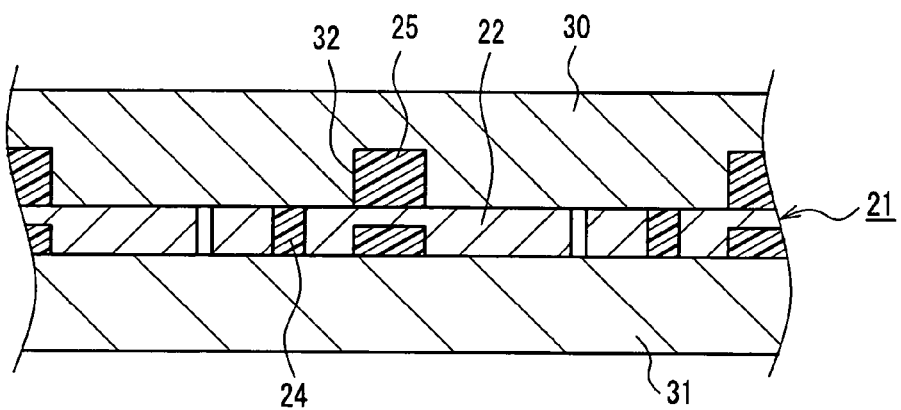
Figure 8C:
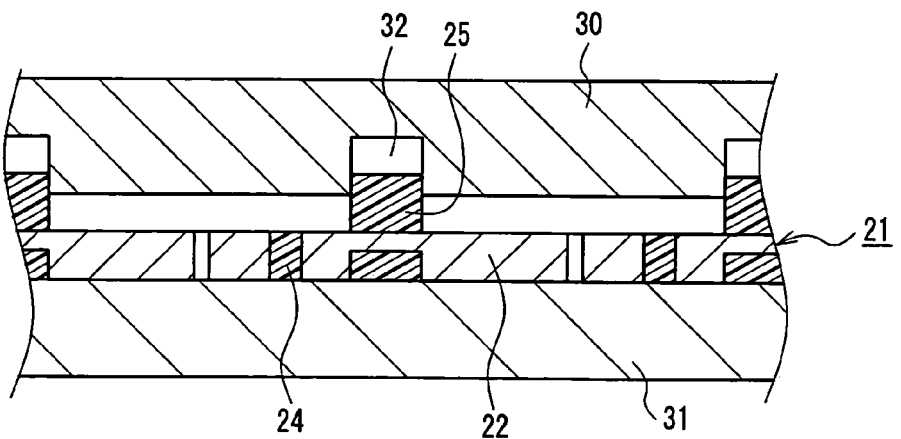

Next, as shown in FIG. 8B, a resin is filled into the cavity, and the base 24 and the ribs are molded. After that, the molds are opened as shown in FIG. 8C, and a molded product of linked housing-equivalent portions as shown in FIG. 5B is retrieved.

In this molding step, the upper and lower surfaces of the lead portions 22 are clamped by the upper mold 30 and the lower mold 31, ensuring that the mold surfaces and the upper and lower surfaces of the lead portions 22 are consistently in close contact. Moreover, the border between the upper mold 30 and the recessed portion 32 is located above the lead portions 22. As a result, the creation of resin burrs caused by the molding can be effectively suppressed.

Moreover, if a resin sheet for the prevention of resin flash burr can be arranged between the molds and the lead frame 21 when resin-molding the housing, then the creation of burrs can be suppressed even more effectively, Embodiment 3

A method for manufacturing a solid-state imaging device in accordance with Embodiment 3 is explained with reference to FIG. 9. This manufacturing method is largely the same as the manufacturing method according to Embodiment 2, but differs from Embodiment 2 in that for the transparent plate, individually mounted transparent plates are used instead of a transparent plate with a large surface area spanning the region of a plurality of solid-state imaging devices. The first half of the process is the same as that shown in FIG. 5A to 5C, so that further explanations thereof are omitted.

Figure 9A:
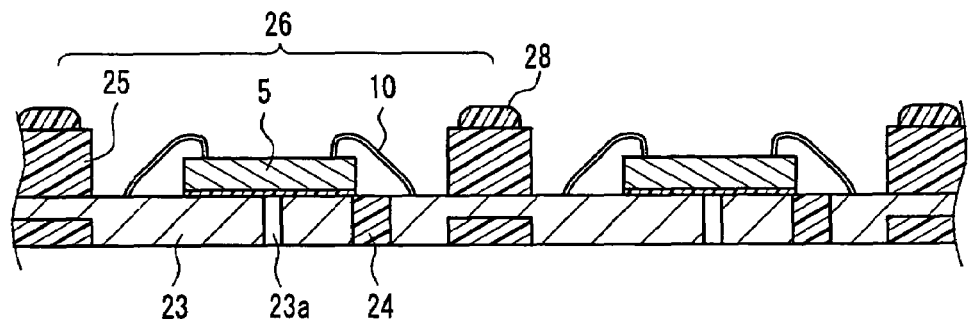
FIG. 9A to 9C are cross-sectional views showing a method for manufacturing a solid-state imaging device in accordance with Embodiment 3 of the present invention.

As shown in FIG. 9A, the imaging elements 5 are fixed on the die pads 23 within the inner space of the housing-equivalent portions 26 that are enclosed by the ribs 25, and after connecting them with thin metal wires 10, the adhesive 28 is applied on the upper surface of the ribs 25.

Figure 9B:
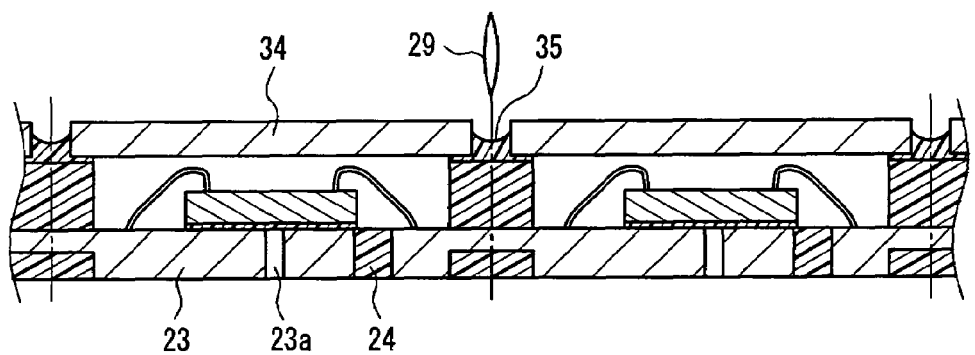

Next, as shown in FIG. 9B, transparent plates 34, each corresponding to one of the housing-equivalent portions 26, are placed thereon. The size of the transparent plates 34 is chosen such that peripheral edges of adjacent transparent plates 34 form a predetermined gap on the upper surface of the ribs 25. Consequently, when the transparent plates 34 are placed on the adhesive 28, the adhesive 28 enters the gap between the transparent plates 34 and forms a fillet 35.

Figure 9C:
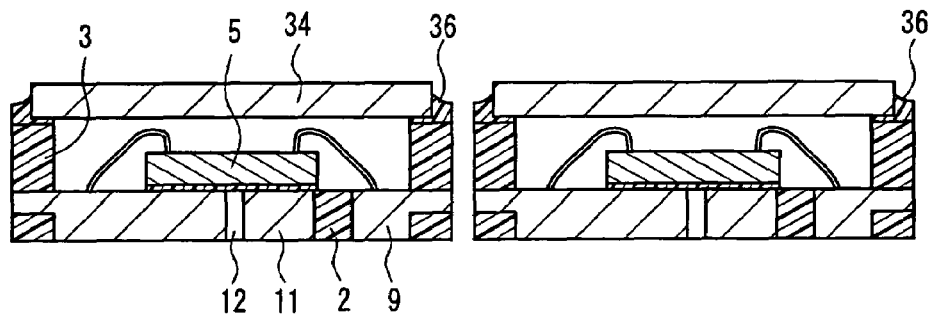
Figure 10:
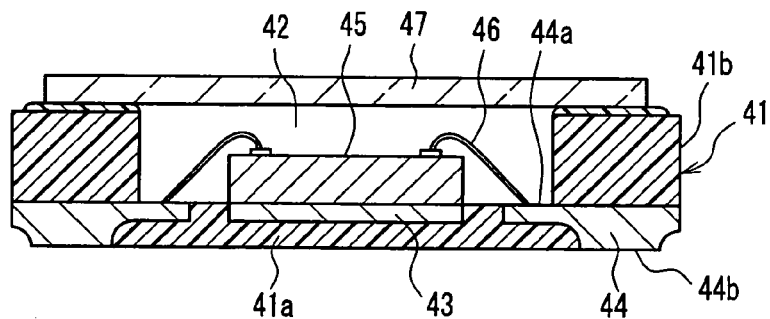
FIG. 10 is a cross-sectional view of a conventional solid-state imaging device.
Figure 11:
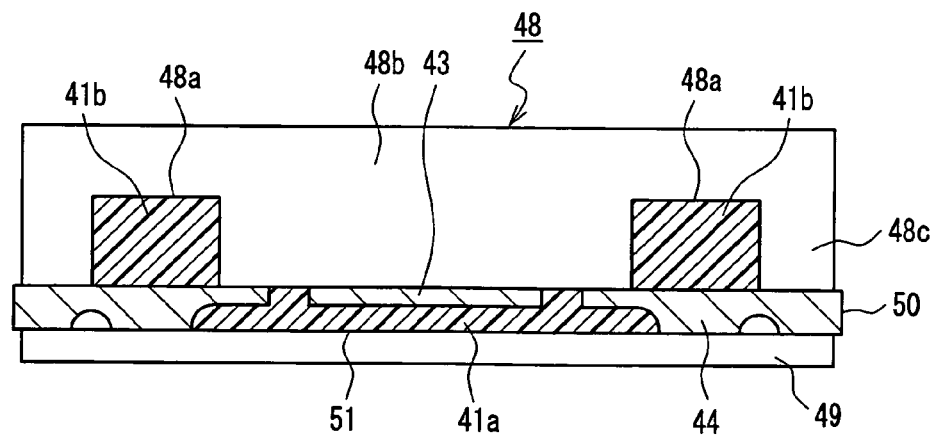
FIG. 11 is a cross-sectional view showing the step of molding the housing of this solid-state imaging device.

Next, the fillet 35, the ribs 25, the lead portions 22 and the base 24 are cut with the dicing blade 29, and separated into pieces forming individual solid-state imaging devices, as shown in FIG. 9C. As in Embodiment 2, the cutting is performed in a direction that is perpendicular to the base 24 such that the width of the ribs 25 is cut in half with respect to the planar shape. As a result, the divided ribs 25, lead portions 22 and base 24 form metal lead pieces 9 and a housing 1 made of a base 2 and ribs 3, which constitute individual solid-state imaging devices. The fillets 36 remain at the peripheral edge of the transparent plate 34.

With this manufacturing method, fillets 36 are formed at the peripheral edge of the transparent plate 34 and the transparent plate 34 is securely fixed, even if the width of the ribs 25 is not sufficiently large.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A solid-state imaging device, comprising:
    a housing having a base and ribs forming a rectangular frame that are molded in one piece with a resin;
    a plurality of metal lead pieces embedded in the housing, the metal lead pieces having an inner terminal portion facing an inner space of the housing, an outer terminal portion exposed on a bottom surface of the housing, and a lateral electrode portion exposed at an outer lateral surface of the housing;
    an imaging element fixed on the base in the inner space of the housing;
    connecting members connecting electrodes of the imaging element respectively to the inner portions of the metal lead pieces; and
    a transparent plate fixed to an upper surface of the ribs;
    wherein a die pad is embedded in a center portion of the base so that upper and lower surfaces of the die pad are exposed from the base, and the imaging element is adhered by a bonding member on the die pad,
    a thickness of the metal lead pieces at the position of the inner terminal portions is substantially the same as the thickness of the base, and the outer terminal portions are formed on an opposite surface corresponding to the position of the inner terminal portions,
    a lower surface of the lateral electrode portions of the metal lead pieces is covered by the resin of the base, and
    the die pad has a through hole under the bonding member and the imaging element so that air in an inner space of the housing is ventilated to the outside through the through hole.

2. The solid-state imaging device according to claim 1, wherein a surface of the outer terminals and the die pad is formed substantially flush with a reverse surface of the base.

3. The solid-state imaging device according to claim 1, wherein a surface of the outer terminals and the die pad protrudes from a reverse surface of the base.

4. The solid-state imaging device according to claim 1, wherein the bonding member is an air permeable adhesive tape.

5. The solid-state imaging device according to claim 1, wherein a lower surface of the peripheral portion of the imaging element is provided with a bevel cut portion and the through hole is provided in correspondence with the bevel cut portion.

* * * * *